(12) United States Patent
Hebert et al.

(10) Patent No.: US 6,222,229 B1
(45) Date of Patent: *Apr. 24, 2001

(54) SELF-ALIGNED SHIELD STRUCTURE FOR REALIZING HIGH FREQUENCY POWER MOSFET DEVICES WITH IMPROVED RELIABILITY

(75) Inventors: Francois Hebert, San Mateo; Szehim Ng, Campbell, both of CA (US)

(73) Assignee: CREE, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/333,123

(22) Filed: Jun. 14, 1999

Related U.S. Application Data

(60) Provisional application No. 60/120,741, filed on Feb. 18, 1999.

(51) Int. Cl.[7] ................................................. H01L 29/76
(52) U.S. Cl. ..................... 257/327; 257/327; 257/328; 257/329; 257/365
(58) Field of Search ................................. 257/327, 328, 257/329, 365, 275, 336, 344, 320, 664, 340, 488

(56) References Cited

U.S. PATENT DOCUMENTS

| | | | |
|---|---|---|---|
| 5,252,848 | | 10/1993 | Adler et al. ........................... 257/328 |
| 5,359,221 | * | 10/1994 | Miyamoto et al. .................... 257/408 |
| 5,574,294 | * | 11/1996 | Shepard ................................ 257/66 |
| 5,798,278 | * | 8/1998 | Chan et al. ........................... 437/43 |
| 5,825,065 | * | 10/1998 | Corsi et al. .......................... 257/328 |
| 5,883,396 | * | 3/1999 | Reedy et al. ............................. 257/9 |
| 5,912,490 | | 6/1999 | Hebert et al. ......................... 257/340 |
| 5,973,367 | * | 10/1999 | Williams .............................. 257/365 |
| 5,977,588 | * | 11/1999 | Patel ..................................... 257/328 |
| 5,981,998 | * | 11/1999 | Frisina et al. ........................ 257/339 |

FOREIGN PATENT DOCUMENTS

| | | | | |
|---|---|---|---|---|
| 402158171 | * | 6/1990 | (JP) | ..................................... 257/327 |
| 402267971 | * | 11/1990 | (JP) | ..................................... 257/327 |
| 405110102 | * | 11/1990 | (JP) | ..................................... 257/327 |
| 405152342 | * | 6/1993 | (JP) | ..................................... 257/327 |

OTHER PUBLICATIONS

U.S. application No. 09/139,532, Sze Him Ng et al. (Art Unit 2815), Aug. 25, 1998.

* cited by examiner

*Primary Examiner*—Eddie C. Lee
*Assistant Examiner*—Edgardo Ortiz
(74) *Attorney, Agent, or Firm*—Townsend and Townsend and Crew LLP

(57) ABSTRACT

A high frequency power field effect transistor has a self-aligned gate-drain shield adjacent to the gate and overlying the drain. Fabrication of the structure does not require complex or costly processing and the resulting self-aligned shield structure minimizes increase to input and output capacitances. Hot carrier injection and related shifts are reduced thereby improving reliability of the transistor.

11 Claims, 13 Drawing Sheets

• Without Optional Shield mask: Shield contact formed on Shield area patterned over thick field oxide

- Optional Sacrificial oxide (also used for implant screen oxide)
- Deep P+ implants (typically used to lower beta of parasitic NPN device)
- Gate oxidation (100 to 1000Å typical, 500-700Å preferred)
- Gate deposition (polysilicon, 1000-6000Å thick, or polycide: 1000-4000Å polysilicon with silicide on top, WSix for example, 1000-4000Å thick)
- Gate patterning and etch

- Channel Mask
- Channel Implant (Boron or BF2, 20 to 100 KeV, 5E12 to 2E14 dose)
- Thin Dielectric Deposition (400 to 2000A Oxide, conformal CVD deposition)
- Channel Drive (900 to 1100C, 60 min to 700 min)

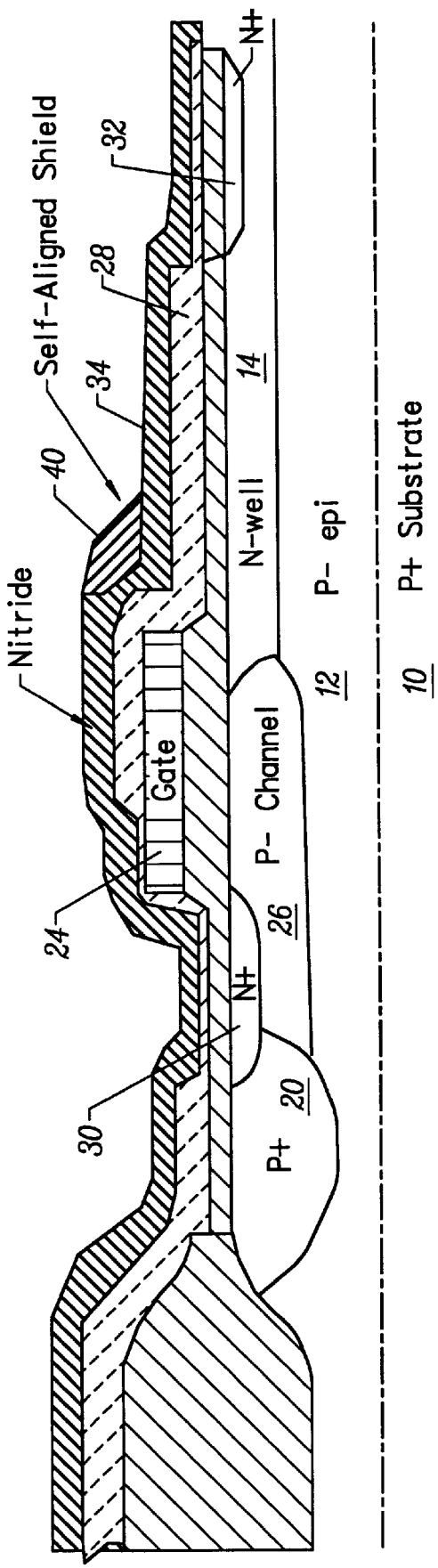

FIG. 2E

- Shield Conductor Deposition
- Either Polysilicon, Polycide (TaSix or WSix), or Metal (Tungsten) conformal deposition, thickness 0.1 to 0.5 microns
- Optional Shield mask which forms contact region at the end of gate structure
- Anisotropic selectie Dry Etch of the Shield material
- Re-patterning of N+ mask to expose source region
- Removal of conductive shield spacer on source side of gate

- Deposition of thick Inter Level Dielectric to passivate wafer and shield
- Preferably oxide, either undoped or BPSG or PSG doped, 0.3 to 1.0 um thick, conformal CVD deposition
- Final Anneal and drive-in of N+ source/drain junction and optional reflow of BPSG dielectric

- Source, Drain, Gate and Shield Contact mask and dry etch to remove dielectric
- Metal deposition
- Metal patterning
- Final passivation Top Layout View - if no mask used to pattern shield Top Layout View - if mask used to pattern shield

- Optional Mask to pattern the SHIELD and create a Shield contact area away from the active area
- Blanket Anisotropic Dry Etch (RIE for example), to form self-aligned Shield along the periphery of the Gate.
- Shown prior to removal of shield on source side of gate

- Without Optional Gate mask: Gate contact overlaps Gate and thick field oxide

• Without Optional Shield mask: Shield contact formed on Shield area patterned over thick field oxide

SELF-ALIGNED SHIELD STRUCTURE FOR REALIZING HIGH FREQUENCY POWER MOSFET DEVICES WITH IMPROVED RELIABILITY

This patent application has the benefit of provisional patent application Ser. No. 60/120,741 filed Feb. 18, 1999.

BACKGROUND OF THE INVENTION

This invention relates generally to insulated gate field-effect transistors (IGFETS), and more particularly the invention relates to reducing gate to drain capacitance in IGFETS including lateral and vertical MOSFETS, especially for use with high frequency power MOSFET devices.

Reduction of gate to drain feedback capacitance ($C_{gd}$ or $C_{rss}$) in MOSFET devices is desired in order to maximize RF gain and minimize signal distortion. $C_{gd}$ is critical since it is effectively multiplied by the voltage gain of the device or $C_{effective} = C_{rss}(1+gmR_1)$ where gm is the transconductance and $R_1$ is the load impedance.

Adler et al., U.S. Pat. No. 5,252,848 discloses an FET structure which includes a performance enhancing conductor shield covering the gate electrode and a portion of the drain region of the FET. A description of such a device operating as a 2 GHz RF transistor is in Technical Digest IEDM conference, 1996, pages 87–90. While the external shield reportedly reduces $C_{gd}$, the dominant component of $C_{gd}$ (gate over drain next to channel) is not shielded. Further, while the external shield is applicable to lateral MOS transistors (LDMOS), the external shield cannot be used with vertical transistors. Additionally, process costs in fabricating such devices can be high.

Copending patent application Ser. No. 08/905,513 filed Aug. 4, 1997, now U.S. Pat. No. 14987-42, discloses a field effect transistor including a lateral MOSFET (LDMOS) and a vertical MOSFET (DMOS) transistor which has reduced gate to drain capacitance by providing a buried shield plate underlying the gate and between the gate and drain of the transistor. More particularly, the transistor comprises a semiconductor body having a major surface, a source region of first conductivity type abutting the surface, a drain region of the first conductivity type abutting the surface and spaced from the source region by a channel of a second conductivity type opposite to the first conductivity type, and a gate electrode overlying the channel and part of the drain and insulated therefrom by a dielectric material. The shield plate is formed prior to the gate and is positioned under the gate and between the gate and the drain and is insulated therefrom. The shield plate preferably includes a contact for electrically biasing the shield plate such as by a fixed DC potential and/or an AC ground potential through a capacitive element. While the structure is an improvement over this structure in U.S. Pat. No. 5,252,848, supra, the gate overlapping the shield plate does not reduce input capacitance.

The present invention is directed to a MOSFET structure having effective reduction of gate to drain parasitic capacitance and reduction of input capacitance.

SUMMARY OF THE INVENTION

In accordance with the present invention a high frequency power field effect device having improved reliability is provided with a self-aligned shield structure between the gate and drain of the device. In preferred embodiments there is no overlap of the gate on the shield, and the shield is not located between the gate and source thereby reducing input capacitance.

In fabricating a field effect device in accordance with the invention a layer of gate material is deposited on an oxide layer on a major surface of a semiconductor substrate, the gate material is selectively masked, and then the exposed gate material is etched along with some of the underlying oxide layer thereby forming a raised gate element on the oxide layer. Thereafter a dielectric layer is formed over the gate element and the oxide layer, and a layer of conductive material is then deposited on the dielectric layer. The dielectric material is then selectively removed by anisotropic etching leaving dielectric material only around the gate element as a self-aligned shield. The dielectric material can then be removed by selective masking and etching between the gate and the source leaving the shield adjacent to the gate and overlying the drain.

Advantageously, there is no need for complex or costly processing, and both the gate to drain capacitance and the input capacitance is minimized since gate to shield overlap is minimized and the shield is removed between the source and gate. Further, hot carrier injection and related parameter shifts which adversely affect reliability are reduced. The peak impact ionization rate at the channel to drain junction is reduced, and the location of the peak impact ionization rate is shifted deeper into the semiconductor substrate and away from the gate oxide and drift region surface.

The invention and objects and features thereof will be more readily apparent from the following detailed description and appended claims when taken with the drawings.

BRIEF DESCRIPTION OF THE DRAWINGS

FIGS. 2A–2G are section views illustrating steps in fabricating a field effect transistor device in accordance with a preferred embodiment of the invention.

DETAILED DESCRIPTION OF ILLUSTRATIVE EMBODIMENTS

Figure 1:
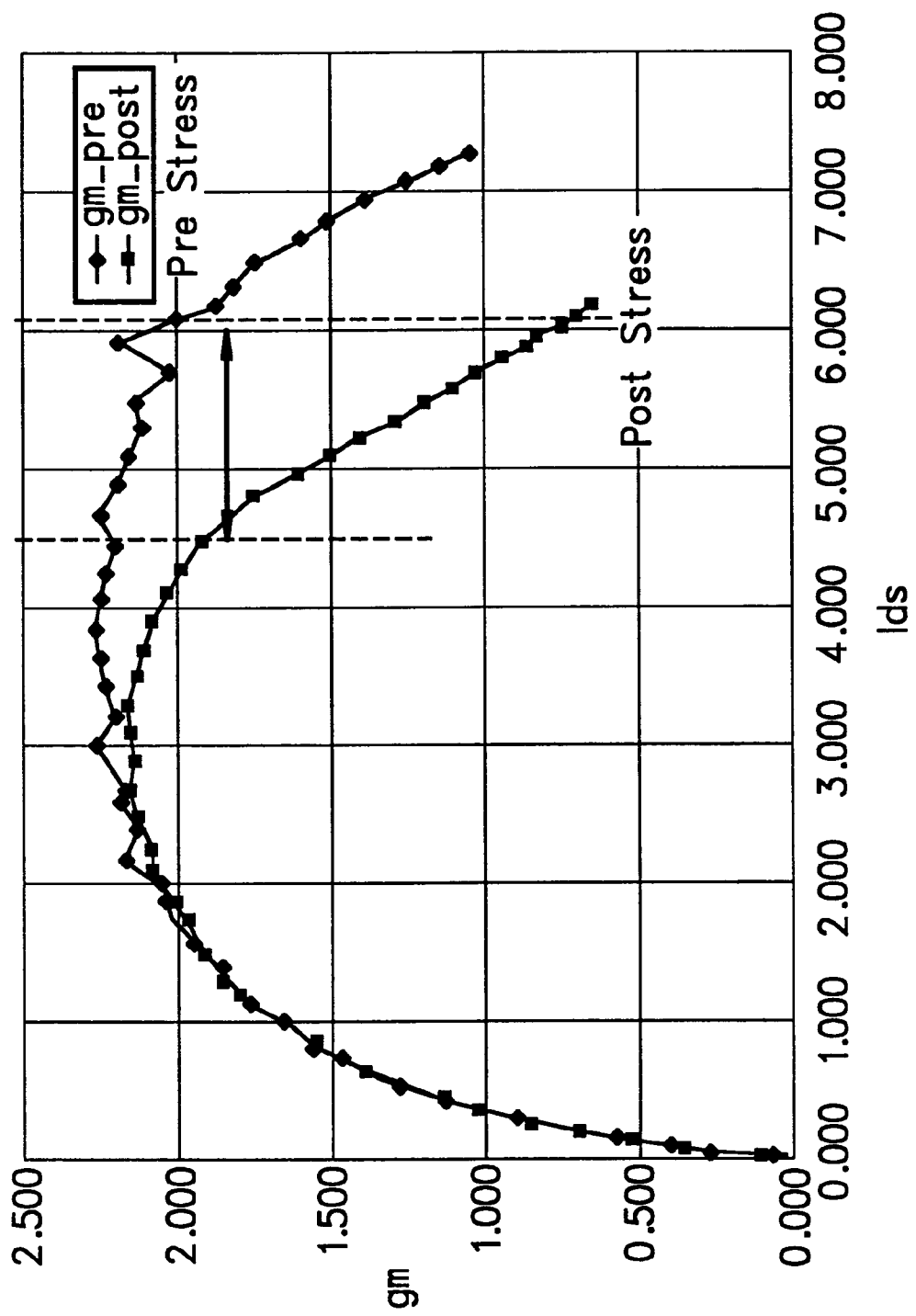
FIG. 1 is a plot of transconductance versus drain current before and after stress and illustrating drift caused by hot carrier injection.

High frequency power field effect transistors inherently have hot carrier injection during device operation which can result in device reliability problems. This stems from the narrow gate length for high frequency operation and high voltage operation to achieve high power. The hot carrier injection effects result in negative shifts of the threshold voltage and maximum current for linear operation. The problem is exacerbated by the additional parasitic capacitance of a shield structure. FIG. 1 is a plot of transconductance versus drain current before and after stress with drift caused by hot carrier injection.

The present invention provides a shield structure self-aligned with the gate on the drain side in which hot carrier injection and related shifts which adversely affect reliability are reduced. A shield self-aligned with the gate is provided on the drain side of the gate with the shield comprising a conductor such as polysilicon, silicide, polycide, or other conductors stable at high temperatures. The shield is formed by anisotropic selective etching of the shield material deposited over the gate. There is no need for complex or costly processing, and gate-drain capacitance is minimized due to the proximity of the buried shield to the gate and with no overlap of the gate on the shield. Input capacitance due to the presence of the shield next to the gate is minimized by removing any overlap of the gate on the shield, and output capacitance increase is minimized since the shield length is limited due to the controlled thickness of deposited shield conductor.

Figure 2A:
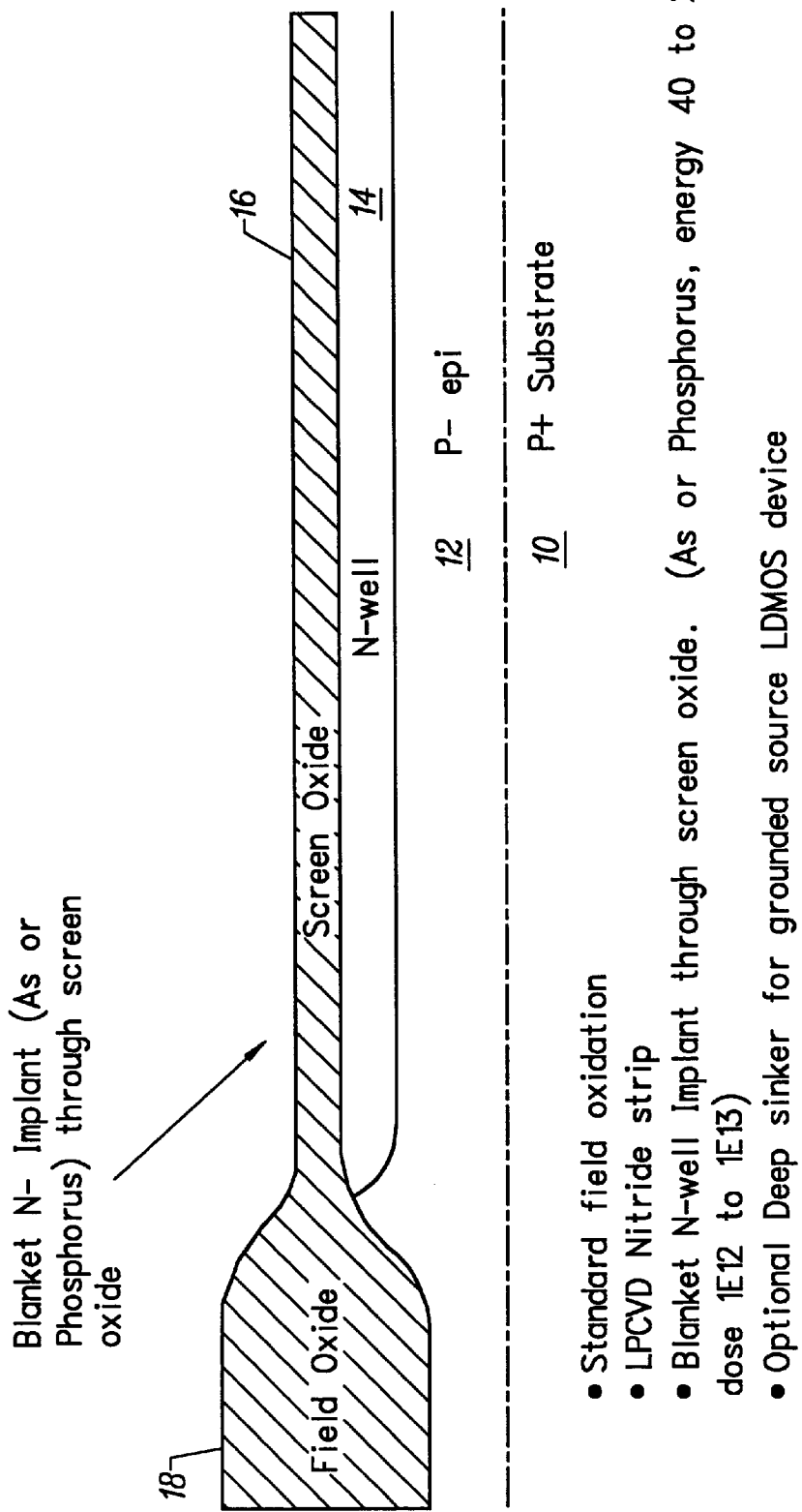

FIGS. 2A–2G are section views illustrating steps in fabricating a high frequency power field effect device with self-aligned gate in accordance with one embodiment of the invention. In FIG. 2A a P+ silicon substrate 10 including a P− epitaxial layer 12 is provided. A blanket N implant (As or Phosphorus) is made through a screen silicon oxide layer 16, to form N-well 14 and then standard field oxidation forms field oxide 18. The N− implant can be at an energy of 40–200 KeV with a dose of 1E12 to 1E13.

Figure 2B:
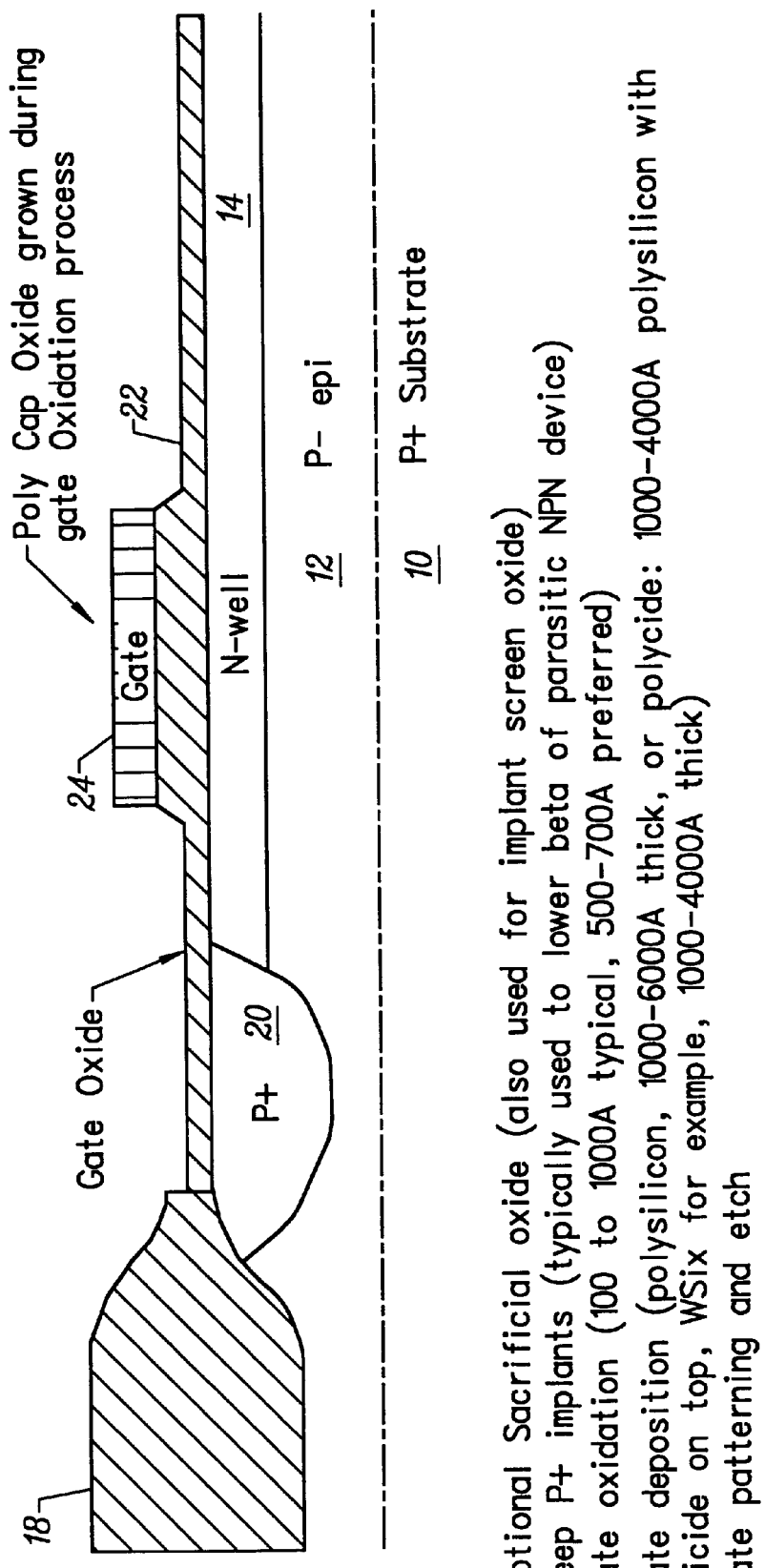

In FIG. 2B a deep P+ implant 20 is made to lower the beta of a parasitic NPN device in the resulting structure and gate oxide 22 (100 to 1000 Å with 500–700 Å preferred) is formed. Gate material is then deposited (polysilicon, 1000–6000 Å thick, or polycide 1000–4000 Å polysilicon with silicide on top or Tungsten silicide WSix 1000–4000 ÅA). The gate material is patterned and etched to form gate element 24. The etching removes a portion of the exposed silicon oxide 22 thus leaving gate 24 on a raised pedestal.

Figure 2C:
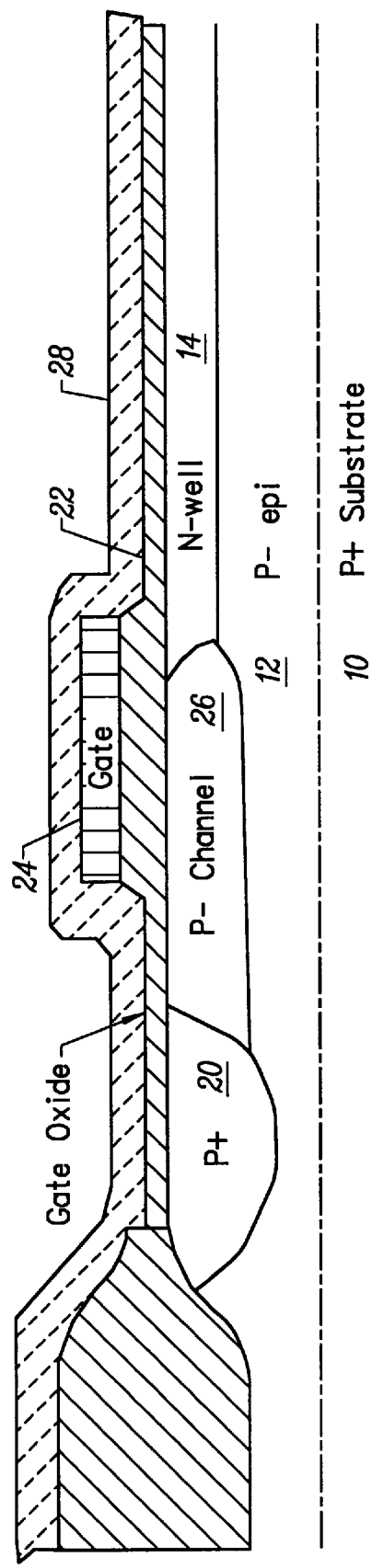

In FIG. 2C a channel implant 26 (Boron or BF2, 20 to 100 KeV, 5E12 to 2E14 dose) forms a channel region and a thin dielectric deposition 28 is formed over the surface (400 to 2000 Å Oxide, conformal CVD deposition). A channel drive step is performed (900 to 1100° C., 60 minutes to 700 minutes).

Figure 2D:
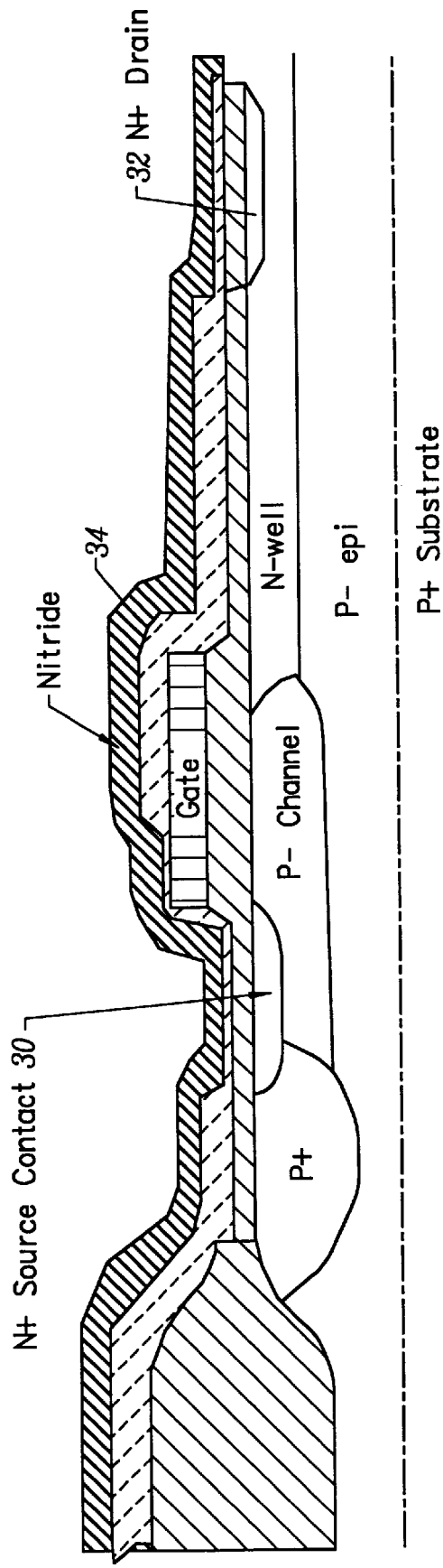

In FIG. 2D N+ source and drain regions 30, 32 are formed by first reducing the thickness of oxide layer 22 over the N+ drain and source locations and then implanting the source and drain regions preferably with Arsenic, 50–180 KeV, 5E15–1E16 dose. Nitride deposition layer 34 is then formed over the top surface.

In FIG. 2E a shield conductor material is deposited over the nitride layer 34 which can be polysilicon, polycide (TaSix or WSix), or metal (Tungsten) with a thickness of 0.1 to 0.5 micron. An optional shield mask can be used to form a contact region at one end of the gate structure and then anisotropic selective dry etch is employed to remove the shield material except for shield material around the gate electrode 24 and around the raised mesa. The self-aligned shield material will surround the gate electrode 24, and a mask is then employed to expose the source side and remove the conductive shield spacer on the source side of the gate.

Figure 2F:
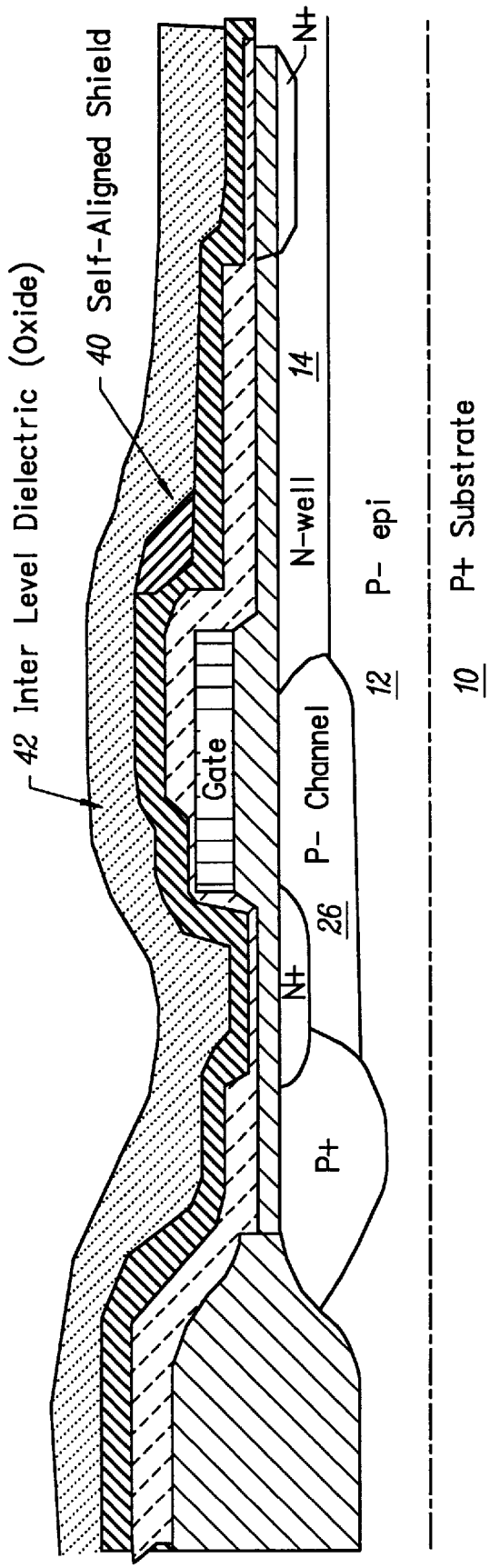

In FIG. 2F a thick inter level dielectric (Oxide) 42 is deposited to passivate the wafer and shield. Dielectric 42 is preferably an oxide either undoped or BPSG or PSG doped, 0.3 to 1.0 micron thick, using conformal CVD deposition. A final anneal and drive-in of the N+ source/drain junction and optional reflow of the BPSG dielectric is then completed.

Figure 2G:
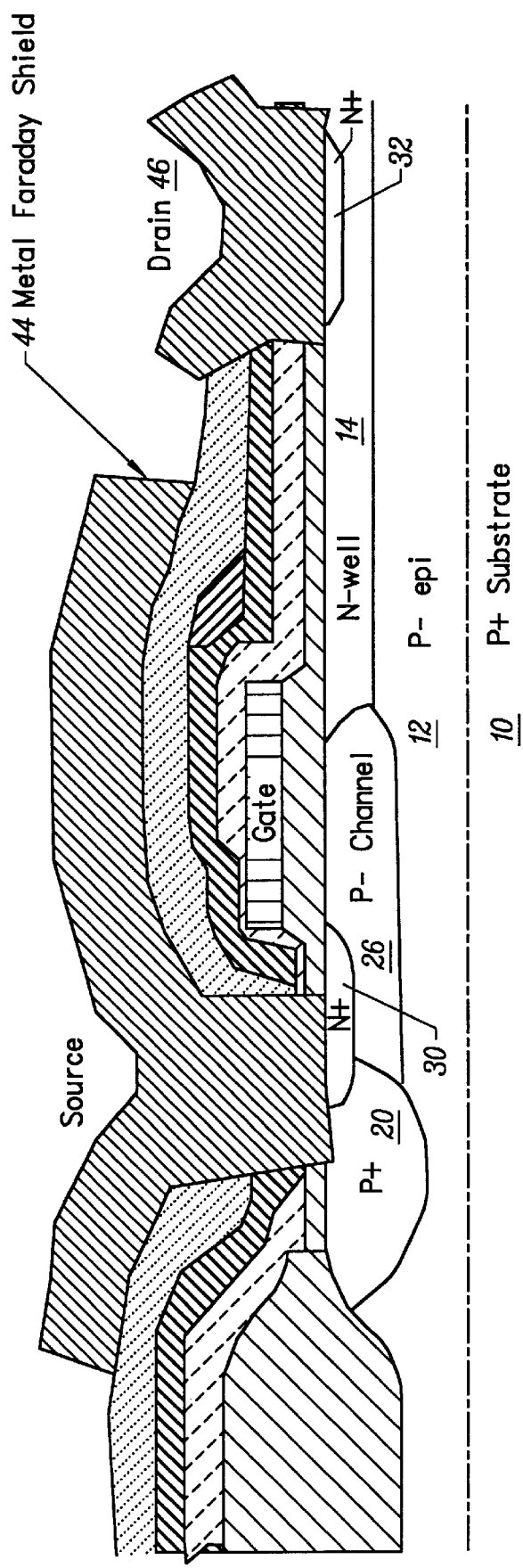

The finished device is shown in FIG. 2G in which source, drain, gate and shield contact mask and dry etch is used to remove the dielectric for the subsequent metal deposition and metal patterning of contacts to the source, drain, gate, and shield and optionally the provision of a metal Faraday shield 44 from the source contact over the device structure.

In operation, the shield can be connected to AC ground or to a DC voltage potential.

Figure 3A:
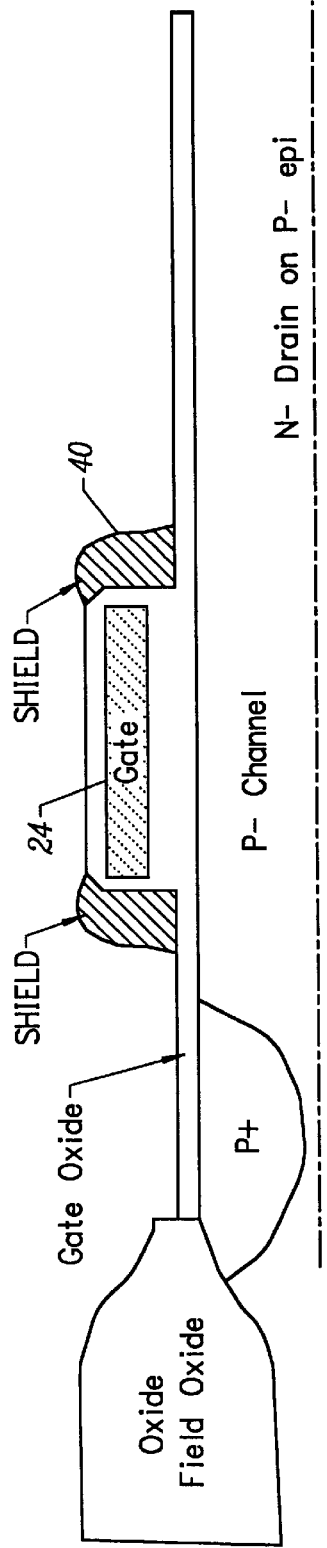
FIGS. 3A, 3B and 3C are a section view and plan views of a self-aligned shield during fabrication in accordance with an embodiment of the invention.
Figure 3B:
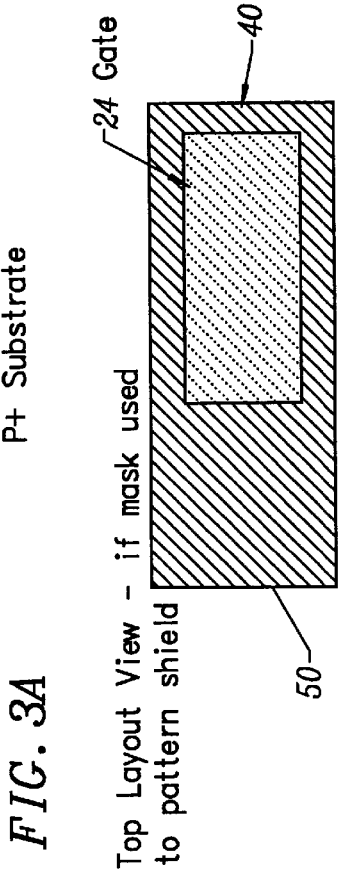
Figure 3C:
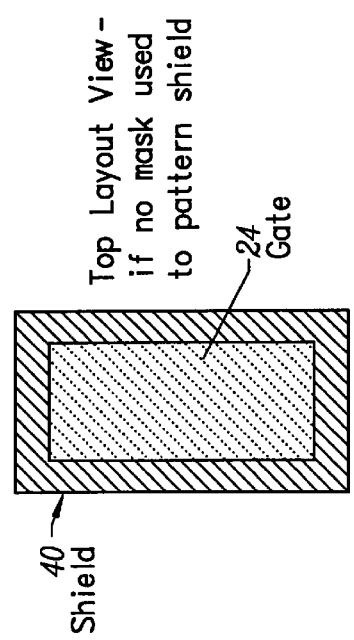

FIGS. 3A, 3B, and 3C are a side view and plan views respectively of the step in forming the self-aligned shield 40. As shown in the side view of FIG. 3A, the self-aligned shield 40 is initially on both the source side and drain side of gate 24 as illustrated in the plan view of FIG. 3B for example. In FIG. 3B no mask is used to pattern the shield, whereas in FIG. 3C a mask is employed so that a shield contact area 50 is provided for the shield but away from gate 24. In FIG. 3A the blanket anisotropic dry etch (RIE for example) forms the self-aligned shield along the periphery of the gate. The views are all prior to removal of the shield on the source side of the gate.

Figure 4A:
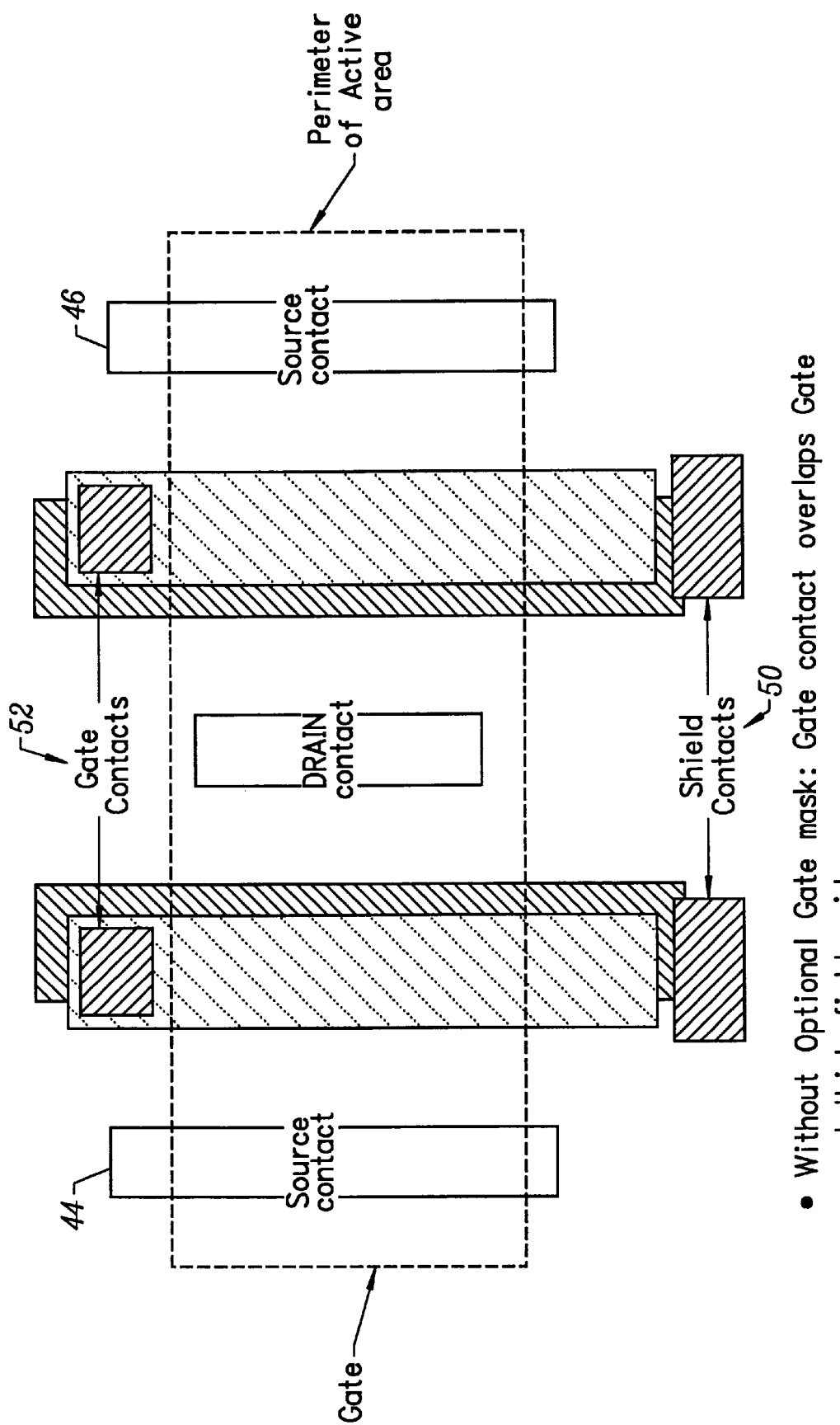
FIGS. 4A and 4B are plan views of a self-aligned shield corresponding to FIGS. 3B and 3C, respectively.
Figure 4B:
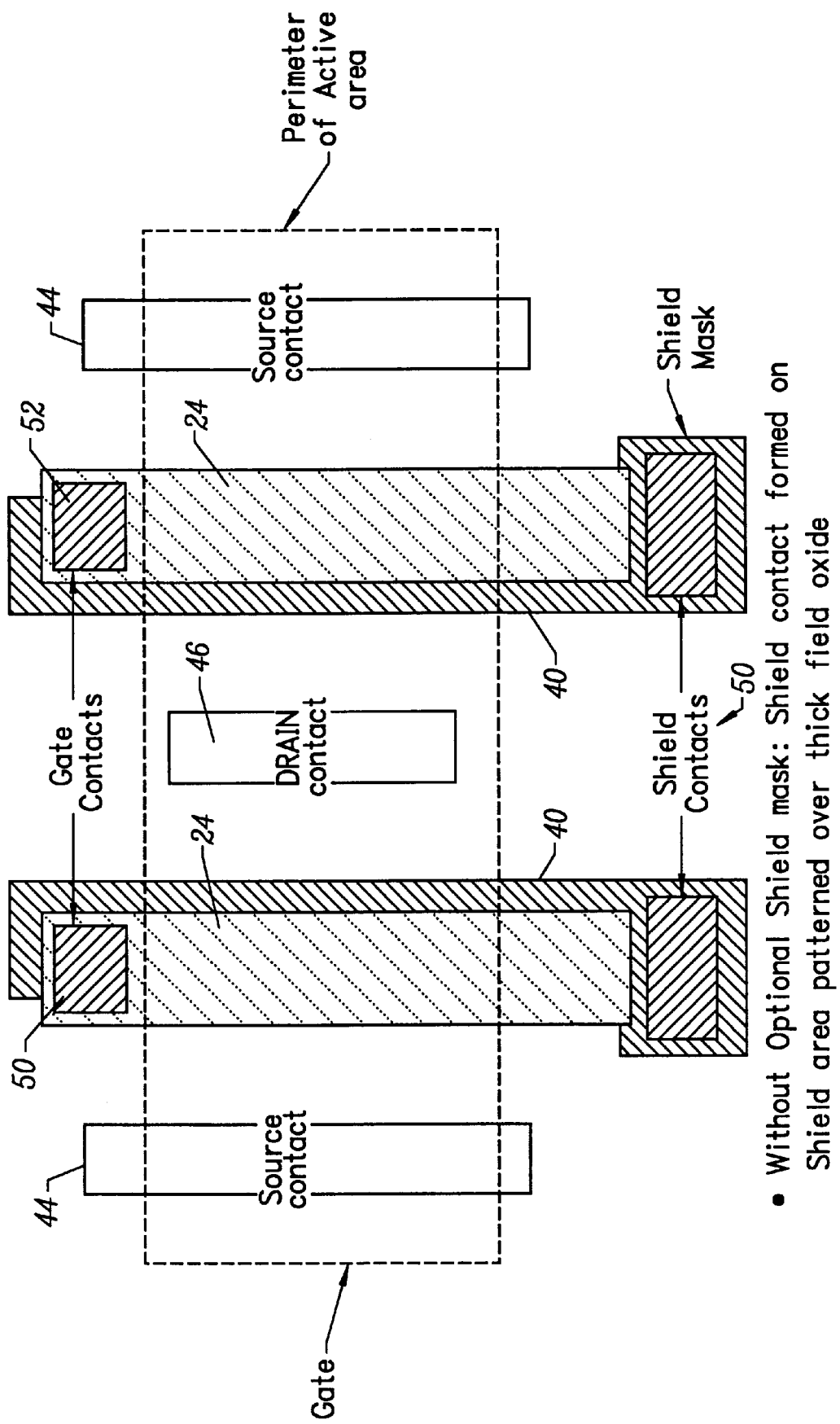

FIGS. 4A and 4B are plan views of the device structure following removal of the shield from the source side of gate 24. Gate contacts 52 are made to the gate region, and shield contacts 50 are made to the extended portions of the shield 40.

Figure 5:
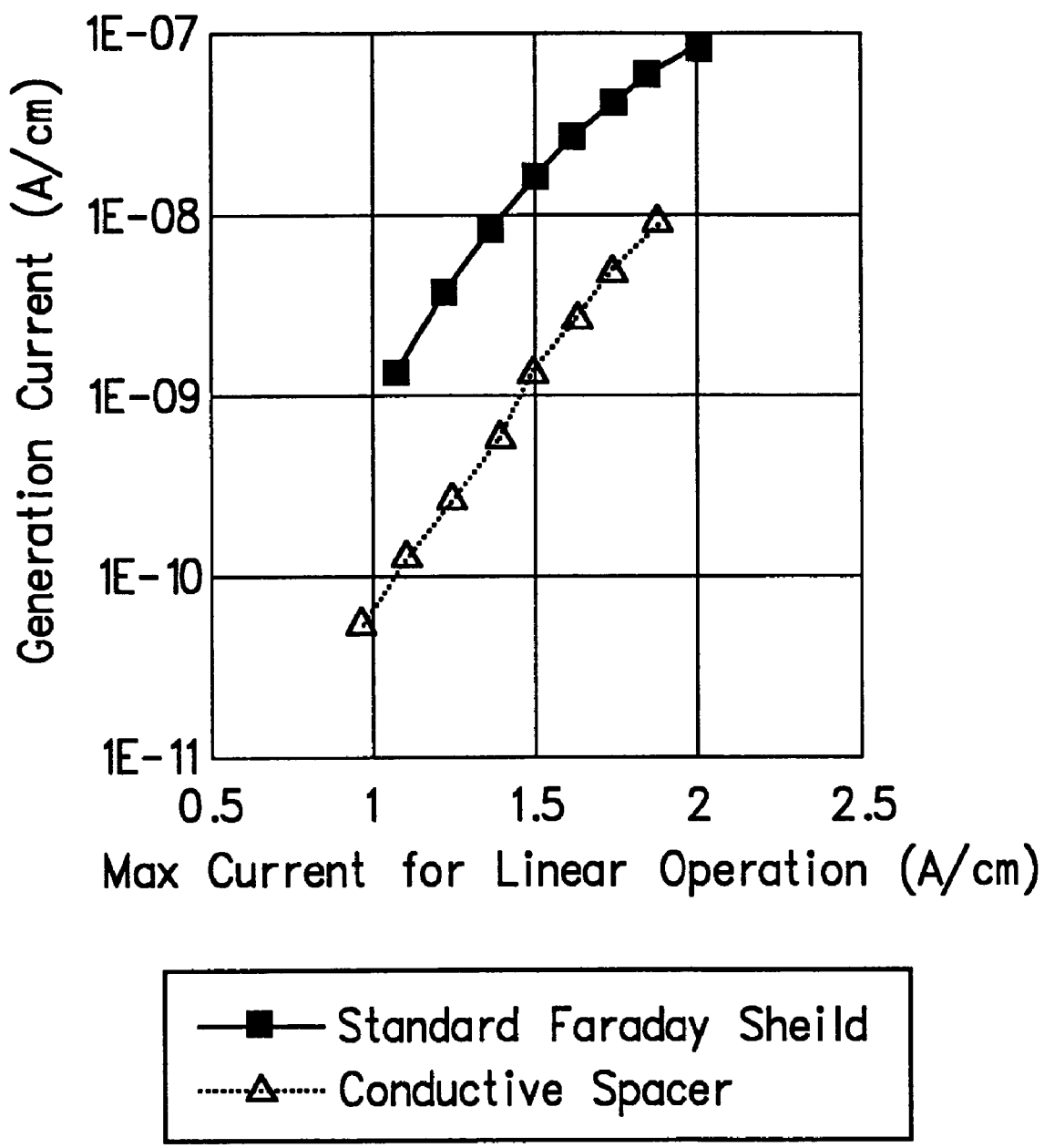
FIG. 5 is a plot of impact ionization rate versus maximum current for linear operation illustrating reduced hot carrier injection in accordance with the invention.
Figure 6B:
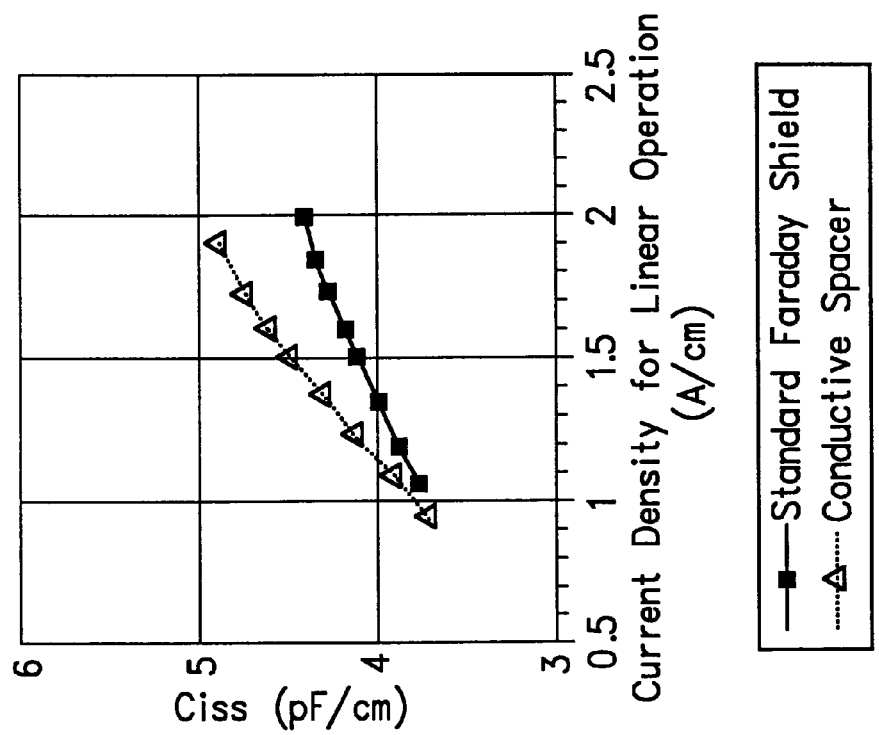
FIGS. 6A and 6B are plots respectively illustrating input capacitance and output capacitance, improvements with the present invention.
Figure 6A:
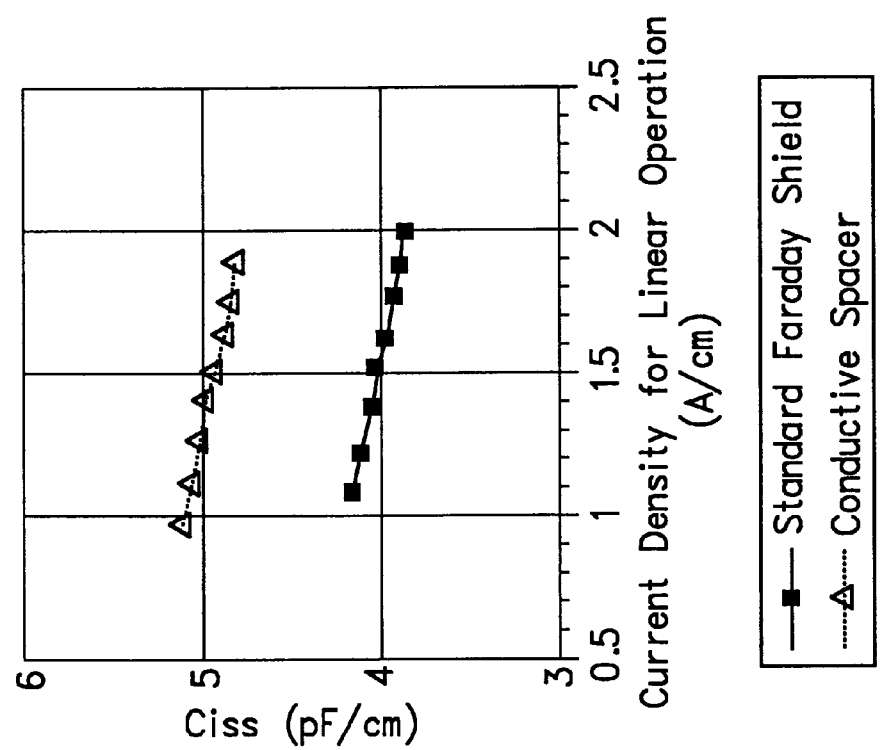

The self-aligned shield structure in accordance with the invention provides performance enhancement by reducing impact ionization rate by a factor of 10, which reduces hot carrier injection. This is illustrated in the plot of FIG. 5 of generation current versus maximum current for linear operation using a standard Faraday shield and using the self-aligned gate-drain shield in accordance with the invention. In realizing the performance enhancement, there is a cost increase in input capacitance of 20–25%, but this is much less than the 50% increase in input capacitance for the buried shield structure for example. Further, there is negligible increase in output capacitance at current densities of 1 A/cm, even at low Vds of 5V. This is illustrated in the graphs of FIGS. 6A, 6B of Ciss versus current density and Coss versus current density respectively.

A high frequency power field effect transistor using a self-aligned shield structure in accordance with the invention has enhanced performance and reliability. While the invention has been described with reference to specific embodiments, the description is illustrative of the invention and is not to be construed as limiting the invention. For example, the self-aligned shield can be employed in extended drain MOSFET transistors as shown and in lateral DMOS transistors for RF/microwave power applications. Thus, various modifications and applications may occur to those skilled in the art without departing from the true spirit and scope of the invention as defined by the appended claims.

What is claimed is:

1. A field effect transistor having reduced gate to drain capacitance comprising:
    a semiconductor body having a major surface,
    a source region of first conductivity-type abutting said surface,
    a drain region of said first conductivity-type abutting said surface and spaced from said source region by a channel,
    a gate overlying said channel and part of said drain and insulated therefrom by a dielectric material, and
    a gate/drain shield between the gate and drain aligned with and spaced from said gate with no overlap of the gate on the shield and overlying said drain and insulated therefrom.

2. The field effect transistor as defined by claim 1 wherein said shield plate comprises a conductor selected from the group consisting of polysilicon, polycide, silicide, salicide, and refractory metals.

3. The field effect transistor as defined by claim 1 wherein said field effect transistor comprises a lateral field effect transistor.

4. The field effect transistor as defined by claim 1 wherein said field effect transistor comprises an extended drain field effect transistor.

5. The field effect transistor as defined by claim 1 wherein said shield plate includes a contact for electrically biasing the shield plate.

6. The field effect transistor as defined by claim 1 wherein said device comprises a RF power amplifier.

7. The field effect transistor as defined by claim 5 wherein said field effect transistor comprises a lateral field effect transistor.

8. The field effect transistor as defined by claim 5 wherein said field effect transistor comprises an extended drain field effect transistor.

9. The field effect transistor as defined by claim 5 wherein said shield plate is coupled to an AC ground.

10. The field effect transistor as defined by claim 8 wherein said shield plate is connected to a DC voltage potential.

11. The field effect transistor as defined by claim 5 wherein said shield plate is connected to a DC voltage potential.

* * * * *